United States Patent
Chu

(10) Patent No.: US 8,621,139 B2
(45) Date of Patent: Dec. 31, 2013

(54) DATA WRITING METHOD FOR WRITING DATA INTO BLOCK OF MULTI-LEVEL CELL NAND FLASH MEMORY BY SKIPPING A PORTION OF UPPER PAGE ADDRESSES AND STORAGE SYSTEM AND CONTROLLER USING THE SAME

(75) Inventor: Chien-Hua Chu, Hsinchu County (TW)

(73) Assignee: Phison Electronics Corp., Miaoli (TW)

( * ) Notice: Subject to any disclaimer, the term of this patent is extended or adjusted under 35 U.S.C. 154(b) by 948 days.

(21) Appl. No.: 12/197,477

(22) Filed: Aug. 25, 2008

(65) Prior Publication Data

US 2009/0307413 A1    Dec. 10, 2009

(30) Foreign Application Priority Data

Jun. 9, 2008 (TW) .............................. 97121383 A

(51) Int. Cl.
G06F 12/00 (2006.01)
(52) U.S. Cl.
USPC .................................. 711/103; 711/E12.008
(58) Field of Classification Search
USPC .......................................... 711/103, E12.008
See application file for complete search history.

(56) References Cited

U.S. PATENT DOCUMENTS

| | | | |
|---|---|---|---|
| 5,930,167 A * | 7/1999 | Lee et al. ................. | 365/185.03 |
| 2006/0227624 A1* | 10/2006 | Shiga ........................ | 365/189.01 |
| 2006/0282609 A1* | 12/2006 | Jo ................................. | 711/103 |
| 2007/0061502 A1* | 3/2007 | Lasser et al. .................. | 711/103 |
| 2007/0268754 A1 | 11/2007 | Lee et al. | |
| 2008/0002467 A1* | 1/2008 | Tsuji ........................ | 365/185.11 |
| 2008/0288743 A1* | 11/2008 | Kim ............................. | 711/206 |
| 2009/0106484 A1* | 4/2009 | Yeh et al. ....................... | 711/103 |

OTHER PUBLICATIONS

"Office Action of Taiwan Counterpart Application", issued on May 11, 2012, p. 1-4, in which the listed reference was cited.

* cited by examiner

Primary Examiner — Larry MacKall
(74) Attorney, Agent, or Firm — J.C. Patents

(57) ABSTRACT

A data writing method for a multi-level cell (MLC) NAND flash memory and a storage system and a controller using the same are provided. The flash memory includes a plurality of blocks. Each of the blocks includes a plurality of page addresses. The page addresses are categorized into a plurality of upper page addresses and a plurality of lower page addresses. The writing speed of the lower page addresses is faster than that of the upper page addresses. The data writing method includes receiving a writing command and data and writing the data into a page address. The page address is skipped when it is an upper page address and a corresponding lower page address stores a valid data written by a previous writing command. Thereby, the accuracy of the data written by the previous writing command is ensured when a programming error occurs to the flash memory.

17 Claims, 7 Drawing Sheets

| Lower page address | Upper page address |
|---|---|
| 0 | 4 |
| 1 | 5 |
| 2 | 8 |
| 3 | 9 |
| 6 | 12 |
| 7 | 13 |
| 10 | 16 |
| 11 | 17 |
| ⋮ | ⋮ |
| 110 | 116 |
| 111 | 117 |
| 114 | 120 |
| 115 | 121 |
| 118 | 124 |
| 119 | 125 |
| 122 | 126 |
| 123 | 127 |

(a)

| Lower page address | Upper page address |
|---|---|
| 0 | 4 |
| 1 | 5 |
| 2 | 8 |
| 3 | 9 |
| 6 | 12 |
| 7 | 13 |
| 10 | 16 |
| 11 | 17 |
| ⋮ | ⋮ |
| 110 | 116 |
| 111 | 117 |
| 114 | 120 |
| 115 | 121 |
| 118 | 124 |
| 119 | 125 |
| 122 | 126 |
| 123 | 127 |

(b)

| Lower page address | Upper page address |
|---|---|
| 0 | 4 |
| 1 | 5 |
| 2 | 8 |
| 3 | 9 |
| 6 | 12 |
| 7 | 13 |
| 10 | 16 |
| 11 | 17 |
| ⋮ | ⋮ |
| 110 | 116 |
| 111 | 117 |
| 114 | 120 |
| 115 | 121 |
| 118 | 124 |
| 119 | 125 |
| 122 | 126 |
| 123 | 127 |

FIG. 5

DATA WRITING METHOD FOR WRITING DATA INTO BLOCK OF MULTI-LEVEL CELL NAND FLASH MEMORY BY SKIPPING A PORTION OF UPPER PAGE ADDRESSES AND STORAGE SYSTEM AND CONTROLLER USING THE SAME

CROSS-REFERENCE TO RELATED APPLICATION

This application claims the priority benefit of Taiwan application serial no. 97121383, filed on Jun. 9, 2008. The entirety of the above-mentioned patent application is hereby incorporated by reference herein and made a part of this specification.

BACKGROUND

1. Technology Field

The present invention generally relates to a data writing method, and more particularly, to a data writing method for writing data into a multi-level cell (MLC) NAND flash memory and a storage system and a controller using the same.

2. Description of Related Art

Along with the widespread of digital cameras, camera phones, and MP3 in recently years, the consumers' demand to storage media has increased drastically too. Flash memory is one of the most adaptable memories for such battery-powered portable products due to its characteristics such as data non-volatility, low power consumption, small volume, and non-mechanical structure. Besides being applied in foregoing portable products, flash memory is also broadly applied to external products such as flash memory cards and flash drives. Thereby, flash memory has become one of the most focused electronic products in recent years.

The development of flash memory has been going from single level cell (SLC) NAND flash memory towards multi-level cell (MLC) NAND flash memory. Due to the physical characteristics of MLC NAND flash memory, the voltage is not very stable when some page addresses thereof are programmed and which may further affect the adjoining page addresses. Accordingly, even though a MLC NAND flash memory can provide larger storage capacity, the storage reliability thereof is not very satisfactory. In other words, the data written by a previous writing command may be damaged when a programming error occurs to a page address written by a current writing command. Besides, the storage capacity of MLC NAND flash memory has been increased constantly so as to be used as hard disk (for example, a solid state drive (SSD)). Thus, data reliability has become one of the most important factors for the success of SSD which uses MLC NAND flash memory as its storage medium.

Accordingly, to resolve the aforementioned problem, a data writing method which can improve the data reliability of MLC NAND flash memory is needed.

SUMMARY

Accordingly, the present invention is directed to a data writing method which ensures the accuracy of data written by a previous writing command when a programming error occurs to a multi-level cell (MLC) NAND flash memory.

The present invention is directed to a controller which uses the aforementioned data writing method for managing a MLC NAND flash memory so as to ensure the accuracy of data written by a previous writing command when a programming error occurs to the MLC NAND flash memory.

The present invention is directed to a storage system which uses the aforementioned data writing method for managing a MLC NAND flash memory so as to ensure the accuracy of data written by a previous writing command when a programming error occurs to the MLC NAND flash memory.

The present invention provides a data writing method for writing data into a MLC NAND flash memory. The MLC NAND flash memory includes a plurality of blocks. Each of the blocks includes a plurality of page addresses, and these page addresses are categorized into a plurality of upper page addresses and a plurality of lower page addresses, wherein the writing speed of the lower page addresses is faster than that of the upper page addresses. The data writing method includes receiving a writing command and data to be written by the writing command and writing the data into the blocks, wherein the page address to be written is skipped when the page address to be written is an upper page address and the lower page address corresponding to the page address to be written stores a valid data written by a previous writing command.

According to an embodiment of the present invention, the data writing method further includes writing the data into the lower page addresses which store no data.

According to an embodiment of the present invention, the step of writing the data into the blocks includes: (1) obtaining the page address to be written from the writing command; (2) determining whether the page address is the lower page addresses of the blocks, wherein step (4) is executed when the page address is the lower page addresses of the blocks, and step (3) is executed when the page address is not the lower page addresses of the blocks; (3) determining whether the lower page address corresponding to the page address stores a valid data written by a previous writing command, wherein step (4) is executed when the lower page address corresponding to the page address does not store the valid data written by the previous writing command, and a page address next to the page address is served as the page address to be written and step (2) is executed when the lower page address corresponding to the page address stores the valid data written by the previous writing command; and (4) writing the data into the page address to be written.

According to an embodiment of the present invention, the step of determining whether the page address is the lower page addresses of the blocks includes determining whether the page address is the lower page addresses of the blocks according to a page address lookup table.

According to an embodiment of the present invention, the data writing method further includes determining whether the data in the blocks is damaged after the system is re-started when the data is written into the page address and an abnormal event occurs.

According to an embodiment of the present invention, the data writing method further includes copying the undamaged data into another block when at least a part of the data in the blocks is damaged.

The present invention provides a controller suitable for a storage device having a MLC NAND flash memory. The MLC NAND flash memory has a plurality of blocks. Each of the blocks includes a plurality of page addresses, and these page addresses are categorized into a plurality of upper page addresses and a plurality of lower page addresses, wherein the writing speed of the lower page addresses is faster than that of the upper page addresses. The controller includes a microprocessor unit, a flash memory interface, a buffer memory, and a memory management module. The flash memory interface is coupled to the microprocessor unit for accessing the MLC NAND flash memory. The buffer memory is coupled to the microprocessor unit for temporarily storing data. The memory management module is coupled to the microprocessor unit and has a plurality of machine instructions which can be executed by the microprocessor unit to perform a plurality of data writing steps to the MLC NAND flash memory. The data writing steps include receiving a writing command and data to be written by the writing command and writing the data into the blocks, wherein the page address to be written is skipped when the page address to be written is an upper page address and the lower page address corresponding to the page address to be written stores a valid data written by a previous writing command.

According to an embodiment of the present invention, the data writing steps further include writing the data into the lower page addresses which store no data.

According to an embodiment of the present invention, the step that the microprocessor unit executes the machine instructions to write the data into the blocks includes: (1) obtaining the page address to be written from the writing command; (2) determining whether the page address is the lower page addresses of the blocks, wherein step (4) is executed when the page address is the lower page addresses of the blocks, and step (3) is executed when the page address is not the lower page addresses of the blocks; (3) determining whether the lower page address corresponding to the page address stores the valid data written by the previous writing command, wherein step (4) is executed when the lower page address corresponding to the page address does not store the valid data written by the previous writing command, and a page address next to the page address is served as the page address to be written and step (2) is executed when the lower page address corresponding to the page address stores the valid data written by the previous writing command; and (4) writing the data to the page address to be written.

According to an embodiment of the present invention, the memory management module has a page address lookup table for recording the corresponding relationship between the lower page addresses and the upper page addresses.

According to an embodiment of the present invention, the data writing steps further includes determining whether the data in the blocks is damaged after the system is re-started when the data is written into the page address and an abnormal event occurs.

According to an embodiment of the present invention, the data writing steps further includes copying the undamaged data into another block when at least a part of the data in the blocks is damaged.

According to an embodiment of the present invention, the storage device is a flash drive, a flash memory card, or a solid state drive (SSD).

The present invention provides a storage system including a MLC NAND flash memory, a transmission connection interface, and a controller. The MLC NAND flash memory is used for storing data. The MLC NAND flash memory includes a plurality of blocks. Each of the blocks includes a plurality of page addresses, and the page addresses are categorized into a plurality of upper page addresses and a plurality of lower page addresses, wherein the writing speed of the lower page addresses is faster than that of the upper page addresses. The transmission connection interface is used for connecting to a host. The controller is coupled to the MLC NAND flash memory and the transmission connection interface. The controller executes a plurality of machine instructions of a memory management module so as to execute a plurality of data writing steps. The data writing steps include receiving a writing command and data to be written by the writing command and writing the data into the blocks, wherein the page address to be written is skipped when the page address is an upper page address and the lower page address corresponding to the page address to be written stores a valid data written by a previous writing command.

According to an embodiment of the present invention, the data writing steps further include writing the data into the lower page addresses which store no data.

According to an embodiment of the present invention, the step of the controller executing the machine instructions to write the data into the blocks includes: (1) obtaining the page address to be written from the writing command; (2) determining whether the page address is the lower page addresses of the blocks, wherein step (4) is executed when the page address is the lower page addresses of the blocks, and step (3) is executed when the page address is not the lower page addresses of the blocks; (3) determining whether the lower page address corresponding to the page address stores a valid data written by a previous writing command, wherein step (4) is executed when the lower page address corresponding to the page address does not store the valid data written by the previous writing command, and a page address next to the page address is served as the page address to be written and step (2) is executed when the lower page address corresponding to the page address stores the valid data written by the previous writing command; and (4) writing the data into the page address to be written.

According to an embodiment of the present invention, the memory management module has a page address lookup table for recording the corresponding relationship between the lower page addresses and the upper page addresses.

According to an embodiment of the present invention, the data writing steps further includes determining whether the data in the blocks is damaged after the storage system is re-started when the data is written into the page address and an abnormal event occurs.

According to an embodiment of the present invention, the data writing steps further includes copying the undamaged data into another block when at least a part of the data written in the blocks is damaged.

According to an embodiment of the present invention, the memory management module is a hardware disposed in the controller.

According to an embodiment of the present invention, the memory management module is a firmware stored in the MLC NAND flash memory.

According to an embodiment of the present invention, the memory management module is a firmware stored in a program memory of the controller.

According to an embodiment of the present invention, the transmission connection interface is a PCI Express interface, a USB interface, an IEEE 1394 interface, a SATA interface, a MS interface, a MMC interface, a SD interface, a CF interface, or an IDE interface.

According to the data writing method in the present invention, a data is only written into lower page addresses or upper page addresses corresponding to the lower page addresses which do not store any valid data written by a previous writing command in a MLC NAND flash memory. Thereby, the data written by the previous writing command is not affected even when a programming error occurs to the current writing command, and accordingly the system is prevented from using incorrect data.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 5 is a diagram illustrating an example about how a block is written according to an embodiment of the present invention.

DESCRIPTION OF THE EMBODIMENTS

Figure 1:
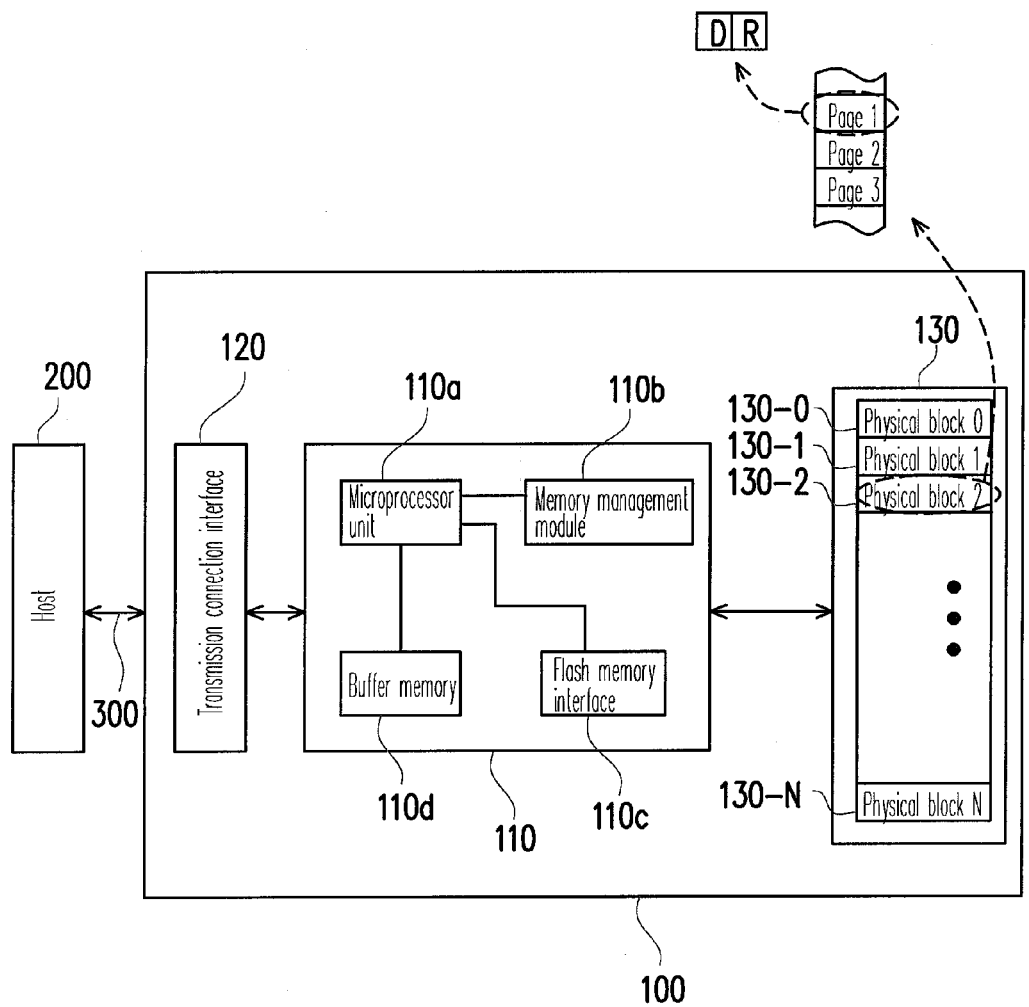
FIG. 1 is a schematic block diagram of a flash memory storage system according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic block diagram of a flash memory storage system according to an embodiment of the present invention. Referring to FIG. 1, the flash memory storage system 100 includes a controller 110, a transmission connection interface 120, and a flash memory 130.

The flash memory storage system 100 is usually used together with a host 200 so that the host 200 can write data into the flash memory storage system 100 or read data from the flash memory storage system 100. In the present embodiment, the flash memory storage system 100 is a solid state drive (SSD). However, in another embodiment of the present invention, the flash memory storage system 100 may also be a flash memory card or a flash drive.

The controller 110 executes a plurality of instructions implemented in hardware or firmware pattern to perform data storing, reading, and erasing along with the transmission connection interface 120 and the flash memory 130. The controller 110 includes a microprocessor unit 110a, a memory management module 110b, a flash memory interface 110c, and a buffer memory 110d.

The microprocessor unit 110a cooperates with the memory management module 110b, the flash memory interface 110c, and the buffer memory 110d to perform various operations of the flash memory storage system 100.

Figure 4A:
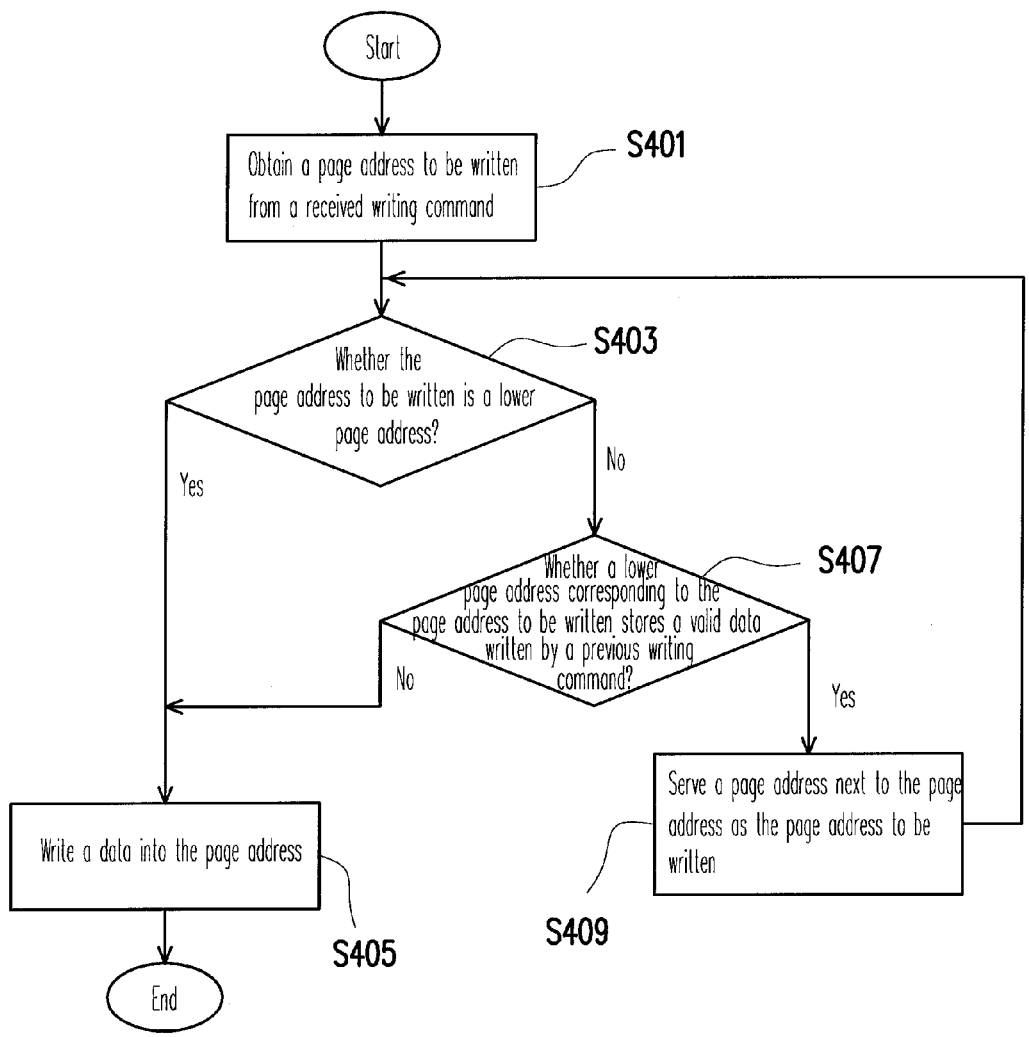
FIG. 4A is a flowchart of a data writing method according to an embodiment of the present invention.
Figure 4B:
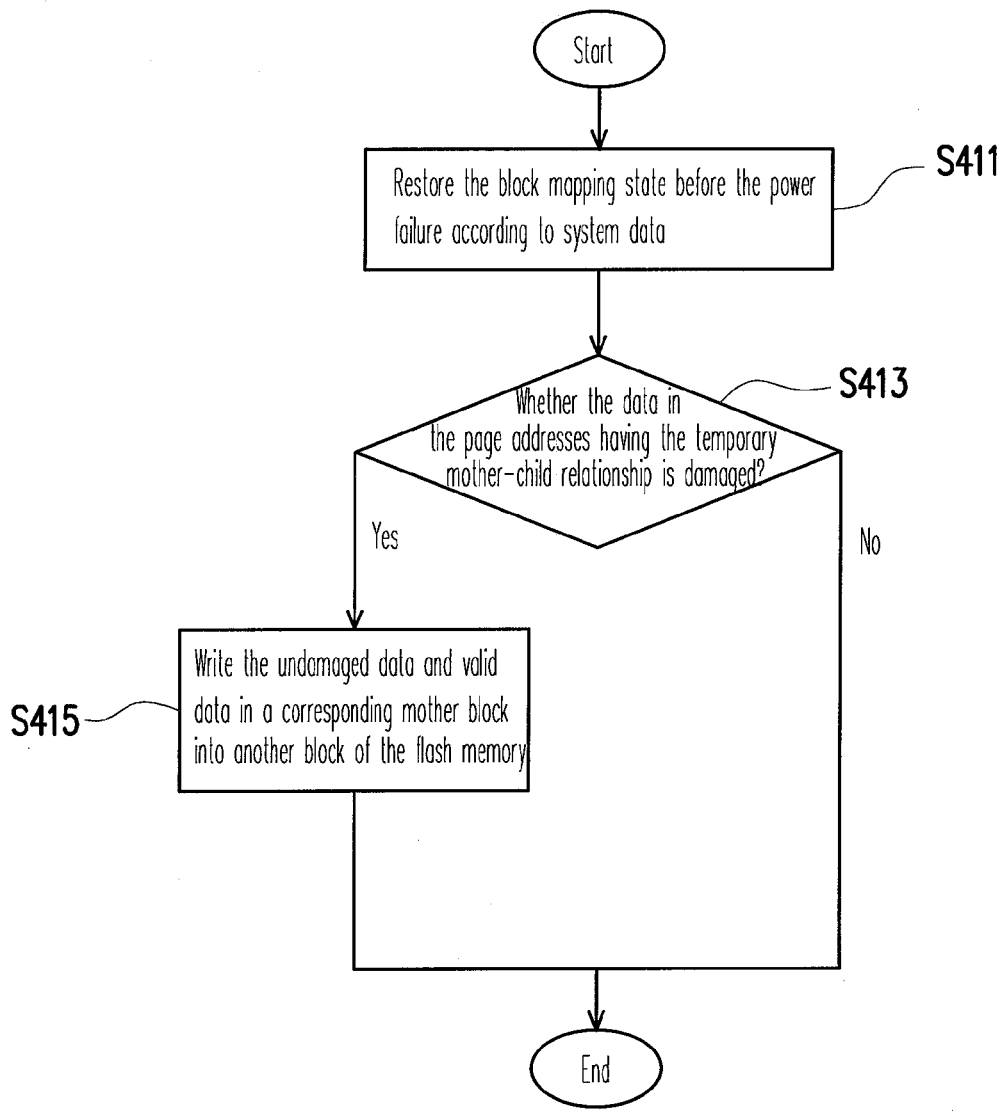
FIG. 4B is a flowchart of an abnormal event recovery procedure according to an embodiment of the present invention.

The memory management module 110b is coupled to the microprocessor unit 110a. The memory management module 110b has a plurality of machine instructions which can be executed by the microprocessor unit 110a for managing the flash memory 130, such as executing a wear levelling function, managing bad blocks, and maintaining a mapping table, etc. Particularly, according to the present invention, the memory management module 110b has machine instructions for executing the data writing steps (as shown in FIG. 4A and FIG. 4B) in the present embodiment. To be specific, in the present embodiment, the memory management module 110b is implemented as a firmware in the controller 110. For example, the memory management module 110b is implemented by storing the related machine instructions in a program memory (for example, a read only memory (ROM)), wherein when the flash memory storage system 100 is in operation, the machine instructions of the memory management module 110b is loaded into the buffer memory 110d to be executed by the microprocessor unit 110a.

In another embodiment of the present invention, the machine instructions of the memory management module 110b may also be stored in a specific area (for example, the following system area) of the flash memory 130 as a firmware, and similarly, when the flash memory storage system 100 is in operation, the memory management module 110b is loaded into the buffer memory 110d to be executed by the microprocessor unit 110a. Additionally, in yet another embodiment of the present invention, the memory management module 110b may also be disposed in the controller 110 as a hardware.

The flash memory interface 110c is coupled to the microprocessor unit 110a for accessing the flash memory 130. In other words, the data to be written by the host 200 into the flash memory 130 is converted into a format acceptable to the flash memory 130 by the flash memory interface 110c.

The buffer memory 110d is coupled to the microprocessor unit 110a for temporarily storing system data (for example, a logical-physical block mapping table) or the data to be read or written by the host 200. In the present embodiment, the buffer memory 110d is a static random access memory (SRAM). However, the present invention is not limited thereto, and a dynamic random access memory (DRAM), a magnetoresistive random access memory (MRAM), a phase change random access memory (PRAM), or other suitable memory may also be applied in the present invention.

Even though not shown in the present embodiment, the controller 110 may further include some general function modules for controlling the flash memory, such as an error correction module and a power management module.

The transmission connection interface 120 is used for connecting to the host 200 through a bus 300. In the present embodiment, the transmission connection interface 120 is a peripheral component interconnect express (PCI) Express interface. However, the present invention is not limited thereto, and the transmission connection interface 120 may also be a universal serial bus (USB) interface, an institute of electrical and electronic engineers (IEEE 1394 interface, a serial advanced technology attachment (SATA) interface, a memory stick (MS) interface, a multi media card (MMC) interface, a secure digital (SD) interface, a compact flash (CF) interface, an integrated device electronics (IDE) interface, or other suitable data transmission interface.

The flash memory 130 is coupled to the controller 110 for storing data. The flash memory 130 is substantially divided into a plurality of physical blocks 130-0~130-N. Generally speaking, in a flash memory, data is erased in unit of physical blocks. Namely, each physical block contains the smallest number of memory cells which are erased together. Each physical block is usually divided into a plurality of page addresses (pages). A page addresses is usually the smallest programming unit. However, it should be noted that in some different flash memory designs, the smallest programming unit may also be a sector. Namely, a page address has a plurality of sectors and each sector is served as the smallest programming unit. In other words, page address is the smallest unit for reading and writing data. Each page address is usually divided into a user data area D and a redundant area R, wherein the user data area D is used for storing user data, and the redundant area R is used for storing system data (for example, an error correcting code (ECC)).

Generally speaking, the user data area D has 512 bytes and the redundant area R has 16 bytes in order to correspond to the size of sectors in a disk drive. In other words, a page is a sector. However, a page may also be composed of a plurality of sectors. For example, a page may include four sectors.

Generally speaking, a physical block can be composed of any number of page addresses, such as 64 page addresses, 128 page addresses, and 256 page addresses. The physical blocks 130-0~130-N are usually grouped into several zones. By managing operations of a flash memory based on zones, parallelism of the operations can be increased and the management thereof can be simplified.

Herein, the operation of the flash memory 130 will be described in detail according to the present invention with reference to accompanying drawings. It should be understood that in following descriptions, terms like "select", "move", and "substitute" are only used for describing the operations performed on the physical blocks in the flash memory 130 in a logical concept. In other words, the physical positions of the blocks in the flash memory are not changed; instead, the operations are logically performed on the physical bocks in the flash memory 130.

Figure 2A:
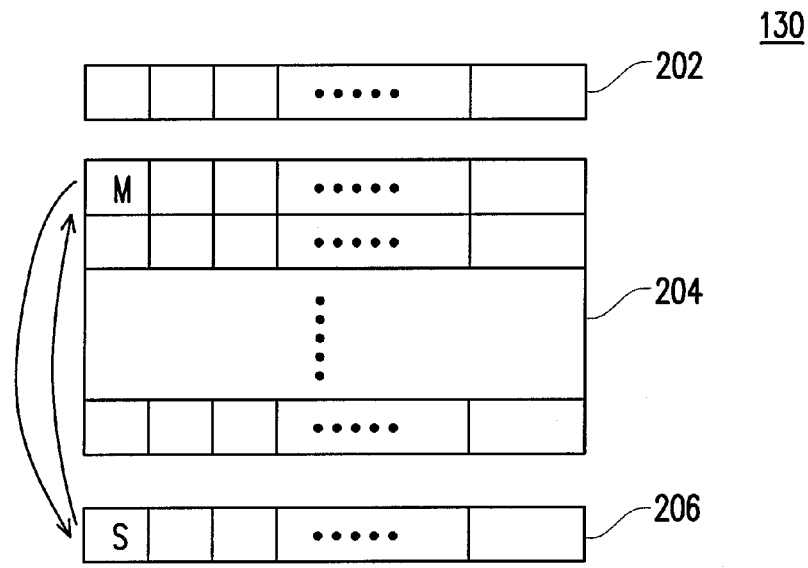
FIGS. 2A-2C are detailed block diagrams of a flash memory and the operation thereof according to an embodiment of the present invention.
Figure 2B:
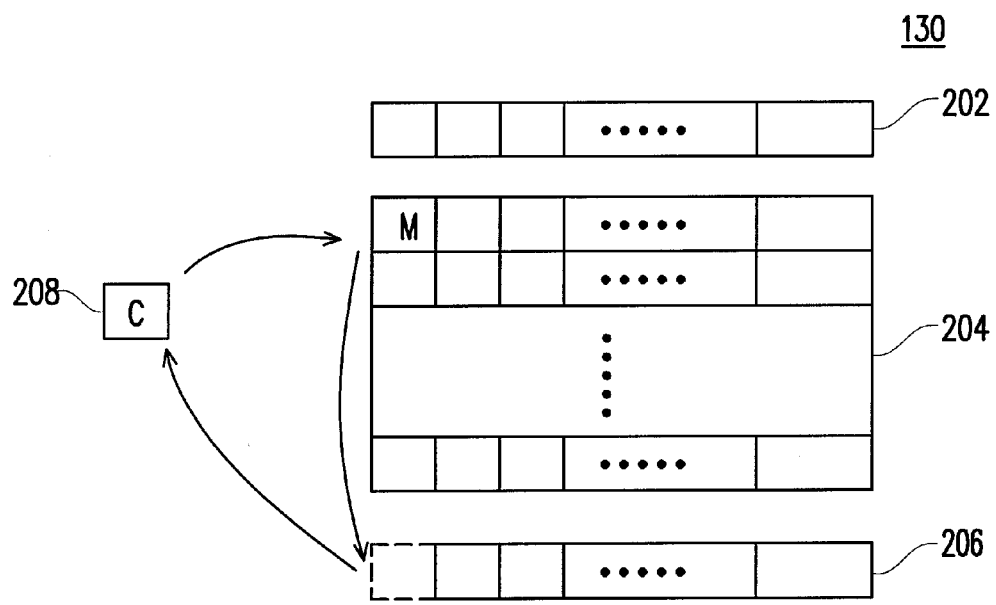
Figure 2C:
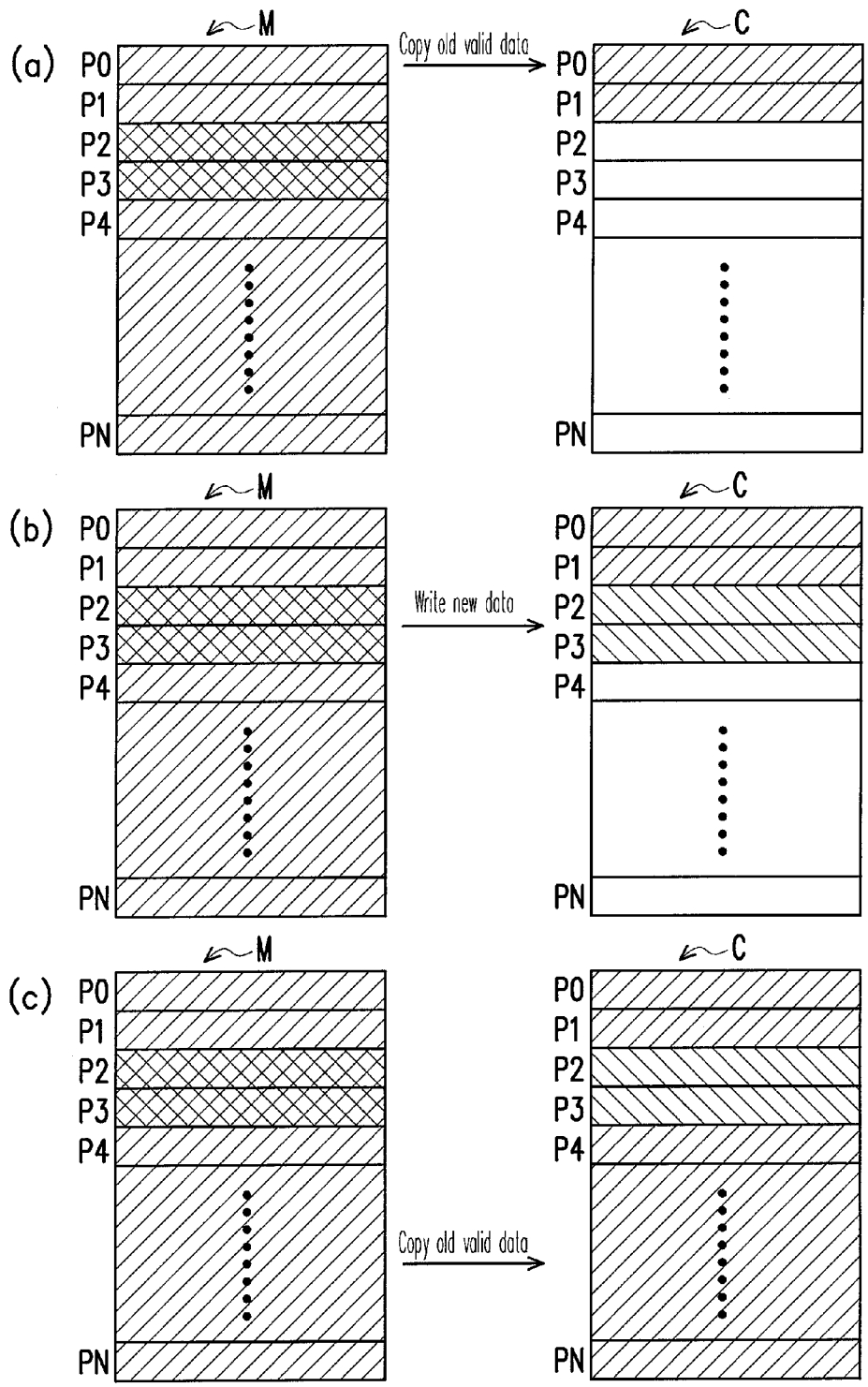

FIGS. 2A~2C are detailed block diagrams of the flash memory 130 and the operation thereof according to an embodiment of the present invention.

Referring to FIG. 2A, in the present embodiment, in order to program (i.e., write and erase) the flash memory 130 more efficiently, the physical blocks 130-1~130-N of the flash memory 130 are logically grouped into a system area 202, a data area 204, and a spare area 206. Generally speaking, more than 90% of the physical blocks in the flash memory 130 belong to the data area 204.

The physical blocks in the system area 202 are used for recording system data, such as the number of zones in the flash memory 130, the number of physical blocks in each zone, the number of page addresses in each physical block, and a mapping table for recording the corresponding relationship between logical blocks and physical blocks, etc.

The physical blocks in the data area 204 are used for storing user data. Generally, these physical blocks are the blocks corresponding to the logical block addresses (LBAs) operated by the host 200.

The physical blocks in the spare area 206 are used for substituting the physical blocks in the data area 204. Thus, the physical blocks in the spare area 206 are blank or available blocks, namely, no data is recorded in these blocks or data recorded in these blocks has been marked as invalid data. To be specific, an erasing operation has to be performed before writing data to an address which already contains a data. However, as described above, data is written into a flash memory in unit of pages while erased from the same in unit of blocks. Since the erase unit is larger than the write unit, the valid page addresses in a physical block have to be copied into another physical block before erasing data from this physical block. Accordingly, to write a new data into a physical block M in the data area 204 which already contains a data, a physical block S is first selected from the spare area 206. Then, the valid data in the physical block M is copied to the physical block S, and the new data is also written into the physical block S. After that, the physical block M is erased and moved to the spare area 206, and at the same time, the physical block S is moved to the data area 204. It should be understood that moving the physical block M to the spare area 206 and moving the physical block S to the data area 204 are to logically link the physical block M to the spare area 206 and logically link the physical block S to the data area 204. It is well understood by those having ordinary skill in the art that the logical relationship of the blocks in the data area 204 can be maintained through a logical-physical block mapping table.

Generally speaking, in order to use the flash memory 130 more efficiently, blocks are further grouped into substitute block 208 logically. FIG. 2B illustrates another operation of a flash memory, and FIG. 2C illustrates the operation of the flash memory in FIG. 2B in detail.

Referring to FIG. 2B and FIG. 2C, the substitute block 208 is a temporary block used for substituting the physical blocks in the data area 204. To be specific, when a physical block C is selected from the spare area 206 for substituting a physical block M in the data area 204, the new data is written into the physical block C, but not all the valid data in the physical block M is instantly moved to the physical block C to erase the physical block M. To be specific, valid data (i.e. pages P0 and P1) in the physical block M before the page address for writing the new data is copied into the physical block C (as shown in FIG. 2C(*a*)), and the new data (i.e. pages P2 and P3 in the physical block C) is written into the physical block C (as shown in FIG. 2C(*b*)). Here, the physical block C containing part of the old valid data and the new data is temporarily linked as the substitute block 208. This is because the valid data in the physical block M may become invalid in the next operation (for example, a writing command), and accordingly instantly moving all the valid data in the physical block M to the physical block C may become meaningless. In the present example, the fact that a plurality of physical block addresses (PBAs) are mapped to one LBA is recorded in the logical-physical block mapping table, namely, the combination of the contents in the physical block M and the physical block C is the content of the corresponding logical block. Such a set of temporary mother-child blocks (i.e., the physical block M and the physical block C) relationship can be determined according to the size of the buffer memory 110*d* in the controller 110, and in the present embodiment, it will use five sets of mother-child blocks at most.

Thereafter, the physical block M and the physical block C are only integrated into one block when the contents in the physical block M and the physical block C are to be actually combined, so that the efficiency in using these blocks can be improved. For example, as shown in FIG. 2C(*c*), to integrate these blocks, the remaining valid data in the physical block M (i.e. pages P4~PN) is coped to the physical block C, the physical block M is then erased and linked to the spare area 206, and at the same time, the physical block C is linked to the data area 204. By now the integration of these blocks is completed.

It should be mentioned that in the data writing method illustrated in FIG. 2C, because the programming specification of flash memory requests that data has to be written into a physical block from the first page to the last page and each bit can only be programmed once (i.e., can only be changed from "1" to "0"), once data is written into a page address of a physical block, a blank physical block has to be selected and the steps illustrated in FIG. 2C have to be performed again to update the data, as shown in FIG. 2B. Thus, when the newly moved data (for example, the pages P0~P1 in FIG. 2C) has to be updated before the physical blocks are combined (i.e., the blocks are in the temporary state as shown in FIG. 2C(*b*)), the old data which has been moved has to be moved again, and this is referred as a random writing mode. For example, a file allocation table (FAT) is usually used in a storage device for managing the storage medium, wherein data in the FAT is accessed very frequently. The random writing mode may be entered because the newly moved data is frequently updated when the FAT is accessed. While entering the random writing mode, the memory management module 110*b* of the controller 110 selects another physical block from the spare area 206 for temporarily writing such frequently updated data so that the operations illustrated in FIG. 2B and FIG. 2C will not be executed repeatedly and accordingly the performance of the flash memory storage system 100 will not be affected by the data moving action of the memory management module 110*b* whenever a data is written.

Figures 3A, 3B:
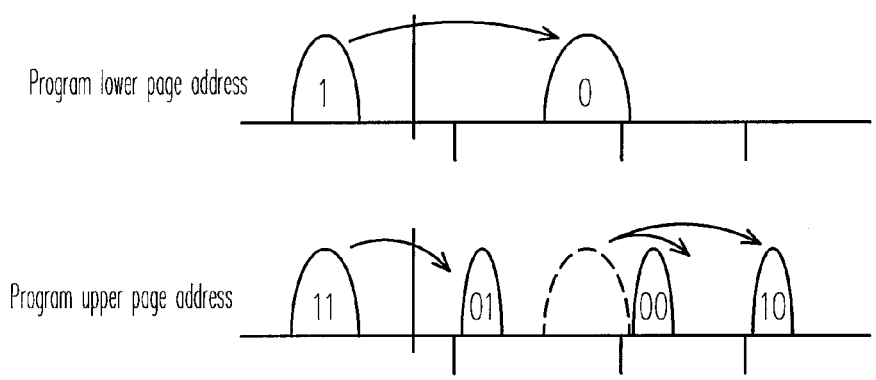
FIG. 3A is a diagram illustrating the two phases for programming a MLC NAND flash memory according to an embodiment of the present invention.
FIG. 3B illustrates page addresses of a block in a MLC NAND flash memory according to an embodiment of the present invention.

Additionally, the flash memory 130 in the present embodiment is a multi-level cell (MLC) NAND flash memory. Blocks in a MLC NAND flash memory are programmed in multiple phases. Taking a 4-level memory cell as an example, as shown in FIG. 3A, the programming of a physical block thereof can be divided into two phases. The first phase is to write the lower page addresses, and the physical characteristic thereof is similar to that of a single level cell (SLC) NAND flash memory. The upper page addresses are programmed only after the first phase is completed. The writing speed of the lower page addresses is faster than that of the upper page addresses. Thus, the page addresses of each block can be categorized into upper page addresses and lower page addresses (as the physical block 130-0 shown in FIG. 3B). In particular, the upper page addresses and the lower page addresses have a coupling relationship. In other words, if an error occurs while programming an upper page address, instability may be caused to the corresponding lower page address (i.e., data may be lost). This is why the reliability of MLC NAND flash memory is lower than that of SLC NAND flash memory. Similarly, in an 8-level memory cell or a 16-level cell, more page addresses are included in the memory cell and data is written in more phases. Herein, the page addresses having the fastest writing speed are referred as the lower page addresses, and the page addresses having other slower writing speeds are referred as the upper page addresses. For example, the upper page addresses include a plurality of pages having different writing speeds.

As described above, in the present embodiment, the page addresses in a block of the flash memory 130 can be categorized into the upper page addresses and the lower page addresses. Thus, a page address lookup table is stored in the memory management module 110*b*, and the page address lookup table records which page addresses in a block belong to the upper page addresses and which page addresses in the block belong to the lower page addresses. It should be understood that the disposition of the upper page addresses and the lower page addresses in FIG. 3B is only an example but not for limiting the present invention. Accordingly, the page address lookup table can be used for recording the corresponding relationship between the lower page addresses and the upper page addresses when a MLC NAND flash memory having different disposition of upper page addresses and lower page addresses is adopted.

It should be mentioned that in the flash memory storage system 100, when the host 200 requests the controller 110 of the flash memory storage system 100 to execute a writing command, the controller 110 still responds the host 200 that the data writing operation is completed when the physical blocks of the flash memory 130 are in the aforementioned mother-child temporary relationship or the aforementioned random writing mode is entered after the controller 110 writes the data. Herein, if the controller 110 executes a next writing command of the host 200 and the data written in the corresponding lower page address by the previous writing command is lost due to a programming error of the upper page address, the host 200 only knows that the current writing command fails and accordingly generates a related error message or performs a rewriting action, but the host 200 considers the data written by the previous writing command to be correct. Accordingly, incorrect data may be read when subsequently the host 200 accesses this page address. Thus, the memory management module 110*b* in the flash memory storage system 100 executes the data writing method provided by the present invention to protect the data.

FIG. 4A is a flowchart of a data writing method according to an embodiment of the present invention. FIG. 5 illustrates an example of writing a block in a flash memory 130 according to an embodiment of the present invention. The left field in FIG. 5(*a*) shows the page addresses belonging to the lower page addresses and the right field in FIG. 5(*a*) shows the page addresses belonging to the upper page addresses, and it is assumed that data has been written by a previous writing command into the lower page addresses 0~3 and the upper page addresses 4~5. In addition, FIG. 5(*b*) shows the data written by the current writing command.

Referring to FIG. 4A and FIG. 5(*b*), in step S401, the controller 110 executes the machine instructions of the memory management module 110*b* to obtain the page address for writing the data into the flash memory 130 from a received writing command. For example, the received writing command indicates that the data is to be written into the page addresses 6~10.

In step S403, whether the page address for writing the data is a lower page address is determined. To be specific, as described above, the smallest programming unit in the present invention is a page address. Thus, the controller 110 programs the flash memory 130 page address by page address, and the controller 110 determines whether a page address is a lower page address when it programs the page address. For example, the controller 110 determines whether the page address for writing the data is a lower page address according to the page address lookup table stored in the memory management module 110*b*.

If it is determined in step S403 that the page address for writing the data is a lower page address, in step S405, the data is directly written into the page address. For example, when it is determined that the writing command is about to write the data into the page addresses 6~7, since the page addresses 6~7 are lower page addresses, the data is directly written into these page addresses (as shown in FIG. 5(*b*)).

If it is determined in step S403 that the page address for writing the data is not a lower page address (i.e., is an upper page address instead), in step S407, whether the lower page address corresponding to the page address for writing the data stores any valid data written by a previous writing command is determined. If it is determined in step S407 that the lower page address corresponding to the page address for writing the data does not store the valid data written by the previous writing command, step S405 is executed to write the data directly into the page address. If it is determined in step S407 that the lower page address corresponding to the page address for writing the data stores the valid data written by the previous writing command, a page address next to the original page address for writing the data is served as the page address for writing the data in step S409 and step S403 is executed. Namely, the page address is skipped (which means the data is not written into the page address) when it is determined that the lower page address corresponding to the page address for writing the data stores the valid data written by the previous writing command.

As shown in FIG. 5(*b*), when it is determined that the writing command is about to write the data into the page address 8, because the page address 8 is a upper page address, whether the lower page address corresponding to the page address 8 (i.e., the page address 2) stores any data written by the previous writing command is determined. Because the page address 2 stores the valid data written by the previous writing command, the page address 8 is skipped and the page address 9 is served as the page address for writing the data, and whether this page address is a lower page address is determined again (i.e., step S403 is executed). However, similarly, the page address 9 is determined to be a upper page address and the corresponding lower page address (i.e., the page address 3) stores valid data written by the previous writing command. Thus, the page address 9 is skipped, and the page address 10 is served as the page address for writing the data, and whether this page address is a lower page address is determined again (i.e., step S403 is executed). Through foregoing determination, it is determined that the page address 10 is a lower page address such that the data is written into the page address 10. Through foregoing steps, the page addresses 8~9 are skipped, and the page addresses 6~7 and 10~12 are used for writing the data by the current writing command.

FIG. 4B is a flowchart of an abnormal event recovery procedure in a data writing method according to an embodiment of the present invention.

Referring to FIG. 4B, when an abnormal event (for example, a power failure) occurs and the storage device is re-started, the block mapping state before the power failure is restored according to the system data (for example, the logical-physical block mapping table or a mother-child block temporary relationship table, etc) in step S411. After that, in step S413, whether the data in the page addresses of the physical blocks having the temporary relationship (for example, the physical block C or the physical block for writing the constantly updated data while entering the random writing mode) is damaged is determined. To be specific, the controller 110 checks the accuracy of the data by using an ECC.

If it is found in step S413 that at least a part of the data in the page addresses of the physical blocks is damaged, in step S415, the undamaged data and the valid data in the corresponding mother block (for example, the physical block M) is written into another block of the flash memory 130 and the mother-child relationship is terminated.

In step S409 of the present embodiment, the data writing method skips the page address and returns to step S403 to determine whether a next page address meets the condition for writing the data. However, in another embodiment of the present invention, when the page address to be written is an upper page address and the lower page address corresponding to the page address to be written stores a valid data written by a previous writing command, the data writing method writes the data into those lower page addresses which store no data.

In overview, according to the present invention, while writing data into a MLC NAND flash memory, the data is only written into the lower page addresses or the upper page addresses corresponding to the lower page addresses which do not store any valid data written by a previous writing command. Thereby, the data written by the previous writing command is not affected when a programming error occurs to the current writing command, and accordingly the system is prevented from using incorrect data.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data writing method, for writing data into a block of a multi-level cell (MLC) NAND flash memory, wherein the block comprises a plurality of page addresses, the page addresses are categorized into a plurality of upper page addresses and a plurality of lower page addresses, and the writing speed of the lower page addresses is faster than the writing speed of the upper page addresses, the data writing method comprising:

(1) receiving a writing command and data to be written;
(2) obtaining a first page address from the block;
(3) determining whether the first page address belongs to the lower page addresses of the block, wherein step (5) is executed if the first page address belongs to the lower page addresses of the block, and step (4) is executed if the first page address does not belong to the lower page addresses of the block;
(4) determining whether a second page address, which belongs to the lower page addresses of the block and has a coupling relationship with the first page address, stores valid data written by a previous writing command, wherein if the second page address does not store the valid data written by the previous writing command, step (5) is executed, and if the second page address stores the valid data written by the previous writing command, step (6) is executed;
(5) writing the data into the first page address; and
(6) skipping the first page address and writing the data into a third page address, which belongs to the lower page addresses of the block and does not have the coupling relationship with the first page address, wherein the skipped first page address does not store data before the block is erased.

2. The data writing method according to claim 1, wherein when all of the lower page addresses of the block are written with data, a part of the upper page addresses of the block is not written with data and another part of the upper page addresses of the block is written with data.

3. The data writing method according to claim 1, further comprising determining whether the data in the block is damaged after the MLC NAND flash memory is re-started when the data is written to the first page address or the third page address and an abnormal event occurs.

4. The data writing method according to claim 3, further comprising copying the undamaged data into another block when at least a part of the data in the block is damaged.

5. A controller, for writing data into a block of a MLC NAND flash memory, wherein the block comprises a plurality of page addresses, the page addresses are categorized into a plurality of upper page addresses and a plurality of lower page addresses, and the writing speed of the lower page addresses is faster than the writing speed of the upper page addresses, the controller comprising:

a microprocessor unit;
a flash memory interface, coupled to the microprocessor unit;
a buffer memory, coupled to the microprocessor unit; and
a memory management module, coupled to the microprocessor unit and having a plurality of machine instructions executed by the microprocessor unit to execute a plurality of data writing steps to the MLC NAND flash memory, wherein the data writing steps comprise:

(1) receiving a writing command and data to be written by the writing command;
(2) obtaining a first page address from the block;

(3) determining whether the first page address belongs to the lower page addresses of the block, wherein step (5) is executed if the first page address belongs to the lower page addresses of the block, and step (4) is executed if the first page address does not belong to the lower page addresses of the block;

(4) determining whether a second page address, which belongs to the lower page addresses of the block and has a coupling relationship with the first page address, stores valid data written by a previous writing command, wherein if the second page address does not store the valid data written by the previous writing command, step (5) is executed, and if the second page address stores the valid data written by the previous writing command, step (6) is executed;

(5) writing the data into the first page address; and (6) skipping the first page address and writing the data into a third page address, which belongs to the lower page addresses of the block and does not have the coupling relationship with the first page address, wherein the skipped first page address does not store data before the block is erased.

6. The controller according to claim 5, wherein when all of the lower page addresses of the block are written with data, a part of the upper page addresses of the block is not written with data and another part of the upper page addresses of the block is written with data.

7. The controller according to claim 5, wherein the data writing steps further comprise determining whether the data in the block is damaged after the storage device is re-started when the data is written into the first page address or the third page address and an abnormal event occurs.

8. The controller according to claim 7, wherein the data writing steps further comprise copying the undamaged data into another block when at least a part of the data in the block is damaged.

9. The controller according to claim 5, wherein the storage device is a flash drive, a flash memory card, or a solid state drive (SSD).

10. A storage system, comprising:
a MLC NAND flash memory, having a plurality of blocks, wherein each of the blocks comprises a plurality of page addresses, the page addresses are categorized into a plurality of upper page addresses and a plurality of lower page addresses, and the writing speed of the lower page addresses is faster than the writing speed of the upper page addresses;
a transmission connection interface; and
a controller, coupled to the MLC NAND flash memory and the transmission connection interface, the controller executing a plurality of machine instructions of a memory management module to execute a plurality of data writing steps, wherein the data writing steps comprise:

(1) receiving a writing command and data to be written by the writing command;

(2) obtaining a first page address from the block;

(3) determining whether the first page address belongs to the lower page addresses of the block, wherein step (5) is executed if the first page address belongs to the lower page addresses of the block, and step (4) is executed if the first page address does not belong to the lower page addresses of the block;

(4) determining whether a second page address, which belongs to the lower page addresses of the block and has a coupling relationship with the first page address, stores valid data written by a previous writing command, wherein if the second page address does not store the valid data written by the previous writing command, step (5) is executed, and if the second page address stores the valid data written by the previous writing command, step (6) is executed;

(5) writing the data into the first page address; and (6) skipping the first page address and writing the data into a third page address, which belongs to the lower page addresses of the block and does not have the coupling relationship with the first page address, wherein the skipped first page address does not store data before the block is erased.

11. The storage system according to claim 10, wherein when all of the lower page addresses of the target block are written with data, a part of the upper page addresses of the target block is not written with data and another part of the upper page addresses of the block is written with data.

12. The storage system according to claim 10, wherein the data writing steps further comprise determining whether the data in the target block is damaged after the storage system is re-started when the data is written into the first page address or the third page address and an abnormal event occurs.

13. The storage system according to claim 12, wherein the data writing steps further comprise copying the undamaged data into another block when at least a part of the data in the target block is damaged.

14. The storage system according to claim 10, wherein the memory management module is a hardware disposed in the controller.

15. The storage system according to claim 10, wherein the memory management module is a firmware stored in the MLC NAND flash memory.

16. The storage system according to claim 10, wherein the memory management module is a firmware stored in a program memory of the controller.

17. The storage system according to claim 10, wherein the transmission connection interface is a peripheral component interconnect express interface, a universal serial bus interface, an institute of electrical and electronic engineers 1394 interface, a serial advanced technology attachment interface, a memory stick interface, a multi media card interface, a secure digital interface, a compact flash interface, or an integrated device electronics interface.

* * * * *